(12) United States Patent
Tomita et al.

(10) Patent No.: US 7,754,529 B2
(45) Date of Patent: Jul. 13, 2010

(54) FLIP CHIP MOUNTING BODY AND METHOD FOR MOUNTING SUCH FLIP CHIP MOUNTING BODY AND BUMP FORMING METHOD

(75) Inventors: Yoshihiro Tomita, Osaka (JP); Koichi Hirano, Osaka (JP); Seiji Karashima, Osaka (JP); Takashi Ichiryu, Osaka (JP); Toshio Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 381 days.

(21) Appl. No.: 11/814,337

(22) PCT Filed: Feb. 2, 2006

(86) PCT No.: PCT/JP2006/301802
§ 371 (c)(1),
(2), (4) Date: Jul. 19, 2007

(87) PCT Pub. No.: WO2006/082909
PCT Pub. Date: Aug. 10, 2006

(65) Prior Publication Data
US 2009/0203169 A1    Aug. 13, 2009

(30) Foreign Application Priority Data
Feb. 3, 2005    (JP) .............................. 2005-027561

(51) Int. Cl.
*H01L 21/00*    (2006.01)

(52) U.S. Cl. ................ 438/108; 438/119; 438/120; 438/613; 257/E21.503; 257/E21.518

(58) Field of Classification Search .............. 438/108, 438/118, 119, 120, 613; 257/E21.503, E21.518
See application file for complete search history.

(56) References Cited

U.S. PATENT DOCUMENTS 4,735,847 A    4/1988    Fujiwara et al.
(Continued)

FOREIGN PATENT DOCUMENTS

JP    60-140790    7/1985
(Continued)

*Primary Examiner*—Michael Trinh
(74) *Attorney, Agent, or Firm*—Hamre, Schumann, Mueller & Larson, P.C.

(57) ABSTRACT

In a flip chip mounted body in which a semiconductor chip (20) having a plurality of electrode terminals (21) is disposed so as to be opposed to a wiring board (10) having a plurality of connection terminals (11), with the connection terminals (11) and the electrode terminals (21) being connected electrically, a resin (13) containing electrically conductive particles (12) is supplied between the connection terminals (11) and the electrode terminals (21), the electrically conductive particles (12) and the resin (13) are heated and melted, and vibrations are applied so as to make them flow. The molten electrically conductive particles (12) are allowed to self-assemble between the connection terminals (11) and the electrode terminals (21), thereby forming connectors (22) that connect them electrically. It becomes more likely that the molten electrically conductive particles in the resin contact the connection terminals or the electrode terminals, whereby the molten electrically conductive particles self-assemble between the electrode terminals and the connection terminals that have a high wettability, making it possible to form connectors for establishing an electric connection between these terminals in a uniform manner.

14 Claims, 6 Drawing Sheets

U.S. PATENT DOCUMENTS

| | | | |
|---|---|---|---|
| 5,145,532 A | 9/1992 | Fukunaga et al. | |
| 5,915,753 A * | 6/1999 | Motomura et al. | 29/830 |
| 6,461,890 B1 * | 10/2002 | Shibata | 438/106 |
| 7,109,058 B2 * | 9/2006 | Yamada et al. | 438/106 |
| 7,180,197 B2 * | 2/2007 | Nishi et al. | 257/783 |
| 2003/0075451 A1 | 4/2003 | Kanda | |
| 2007/0001313 A1 * | 1/2007 | Fujimoto et al. | 257/778 |

FOREIGN PATENT DOCUMENTS

| | | |
|---|---|---|
| JP | 1-157796 | 6/1989 |
| JP | 6-125169 | 5/1994 |
| JP | 6-196486 | 7/1994 |
| JP | 2000-94179 | 4/2000 |
| JP | 2000-332055 | 11/2000 |
| JP | 2003-100790 | 4/2003 |
| JP | 2004-260131 | 9/2004 |

* cited by examiner

FLIP CHIP MOUNTING BODY AND METHOD FOR MOUNTING SUCH FLIP CHIP MOUNTING BODY AND BUMP FORMING METHOD

TECHNICAL FIELD

The present invention relates to a flip chip mounting method for mounting a semiconductor chip on a wiring board and a bump forming method for forming bumps on electrodes of a substrate. In particular, the present invention relates to a flip chip mounted body that is adaptable to a semiconductor chip with a narrower pitch and has high productivity, a method for mounting the same, and a method for forming bumps on substrate electrodes with a narrower pitch.

BACKGROUND ART

In recent years, with a trend toward a higher density and a higher degree of integration of a semiconductor integrated circuit (LSI) used for electronic equipment, the number of pins of electrode terminals of a LSI chip has increased and the pitch thereof has decreased rapidly. For mounting these LSI chips on wiring boards, flip chip mounting is used widely in order to decrease a wiring delay. In this flip chip mounting, solder bumps generally are formed on electrode terminals of the LSI chip, which then are joined to connection terminals formed on the wiring board via these solder bumps at one time.

However, in order to mount a next-generation LSI having more than 5,000 electrode terminals on a wiring board, it is necessary to form bumps that correspond to a narrow pitch of 100 μm or less, but it is difficult to adapt to it with a current technique for forming solder bumps. Moreover, since it is necessary to form a large number of bumps that correspond to the number of the electrode terminals, the productivity has to be raised by shortening a mounting tact (mounting time) for each chip, in order to achieve a cost reduction.

Similarly, in the semiconductor integrated circuit, the increase in the number of the electrode terminals has brought about a transition from peripheral electrode terminals to area-disposed electrode terminals. Moreover, due to the demands for a higher density and a higher degree of integration, a semiconductor process is expected to develop from 90 nm to 65 nm and further to 45 nm. As a result, the wiring becomes even finer, and a capacity between the wirings increases, so that problems of speed increase and power consumption loss have become serious. Accordingly, the demand for lowering a dielectric constant (Low-K) of an insulator film between wiring layers has grown further. Since such Low-K of the insulator film is achieved by making an insulator layer material porous, the mechanical strength thereof is low, which obstructs a thickness reduction of the semiconductor. In addition, when structuring the area-disposed electrode terminals as described above, the Low-K raises a problem in the strength of the porous film, making it difficult to form the bumps on the area-disposed electrodes and achieve the flip chip mounting itself Thus, there is a demand for a low-load flip chip mounting method that is adaptable to the future development of the semiconductor process and suitable for a thinner and higher-density semiconductor.

Conventionally, as a technique for forming bumps, plating, screen printing and the like have been developed. The plating is suitable for a narrow pitch, but has a problem in productivity due to its complicated processes. On the other hand, the screen printing has excellent productivity, but is not suitable for narrowing a pitch because of the use of a mask.

In the light of the problems described above, several techniques for forming solder bumps selectively on electrodes of a LSI chip or a wiring board have been developed recently. These techniques not only are suitable for forming fine bumps but also have excellent productivity because they can form the bumps all at one time, which attract attention as techniques that are adaptable to the mounting of the next-generation LSI on the wiring board.

One of these techniques is called a solder paste method (see Patent document 1, for example). In this technique, a solder paste, which is a mixture of electrically conductive particles and flux, is applied solidly onto a substrate whose surface is provided with electrodes, and the substrate is heated so as to melt the electrically conductive particles, whereby solder bumps are formed selectively on the electrodes with high wettability.

Moreover, in a technique called a super solder method (see Patent document 2, for example), a paste-like composition (chemical reaction deposition-type solder) that contains an organic acid lead salt and metal tin as main components is applied solidly onto a substrate on which electrodes are formed, and the substrate is heated so as to cause a substitution reaction between Pb and Sn, thereby depositing a Pb/Sn alloy selectively on the electrodes of the substrate.

However, in both of the solder paste method and the super solder method, since the paste-like composition is supplied onto the substrate by application, local variations in thickness and concentration occur, resulting in variations in the solder deposition amount for individual electrodes. Consequently it is not possible to achieve bumps with uniform heights. Also, in these method, since the paste-like composition is supplied by application onto the wiring board whose surface is provided with the electrodes, namely, with projections or depressions, a sufficient amount Of solder cannot be supplied onto the electrodes serving as the projections, making it difficult to achieve a desired bump height necessary for the flip chip mounting.

By the way, the flip chip mounting using a conventional bump formation technique further requires a process of injecting a resin called an underfill between the semiconductor chip and the wiring board in order to fix the semiconductor chip on the wiring board, after mounting the semiconductor chip on the wiring board on which bumps are formed.

Then, as a method for establishing an electric connection between opposed electrode terminals of the semiconductor chip and the wiring board and fixing the semiconductor chip to the wiring board both at the same time, a flip chip mounting technique using an anisotropic electrically conductive material (for example, see Patent document 3) has been developed. In this technique, by supplying a thermosetting resin containing electrically conductive particles between the wiring board and the semiconductor chip, and then heating the thermosetting resin while applying pressure to the semiconductor chip at the same time, it is possible to establish the electric connection between the electrode terminals of the semiconductor chip and the wiring board and fix the semiconductor chip to the wiring board at the same time. The conventional bump formation is not needed particularly.

The above-described flip chip mounting using the anisotropic conductive material can be considered to have an excellent productivity because the electric connection and the physical fixing between the semiconductor chip and the wiring board can be achieved at the same time without requiring any bump formation. However; since the electric conduction between the electrodes is achieved by mechanical contact via the electrically conductive particles, it is difficult to achieve a stable conductive state.

Moreover, since the electrically conductive particles interposed between the opposed electrodes are maintained by cohesion due to thermal setting of the resin, the properties of the thermosetting resin such as an elastic modulus and a coefficient of thermal expansion and the properties of the electrically conductive particles such as a particle size distribution have to be regulated, leading to a problem of process control being difficult.

In other words, the flip chip mounting using the anisotropic electrically conductive material has many problems to be solved in terms of reliability if it is to be applied to the next-generation LSI chips with more than 5,000 connection terminals.

Patent document 1: JP 2000-94179 A
Patent document 2: JP 1(1989)-157796 A
Patent document 3: JP 2000-332055 A

DISCLOSURE OF INVENTION

The present invention was made with the foregoing in mind and provides a flip chip mounted body and a method for mounting the same that can be applied to flip chip mounting of next-generation LSIs and have high productivity and high reliability, and a method for forming bumps applying the present technology.

A flip chip mounted body according to the present invention is a flip chip mounted body in which a semiconductor chip having a plurality of electrode terminals is disposed so as to be opposed to a wiring board having a plurality of connection terminals, with the connection terminals of the wiring board and the electrode terminals of the semiconductor chip being connected electrically. A resin containing electrically conductive particles is supplied between the connection terminals of the wiring board and the electrode terminals of the semiconductor chip, the electrically conductive particles and the resin are heated and melted, and vibrations are applied to the molten electrically conductive particles and the molten resin so as to make them flow. The molten electrically conductive particles are allowed to self-assemble between the connection terminals of the wiring board and the electrode terminals of the semiconductor chip, thereby forming connectors that connect the connection terminals and the electrode terminals electrically.

A flip chip mounting method according to the present invention is a flip chip mounting method, in which a semiconductor chip having a plurality of electrode terminals is disposed so as to be opposed to a wiring board having a plurality of connection terminals and the connection terminals of the wiring board and the electrode terminals of the semiconductor chip are connected electrically. The method includes a first process of supplying a resin containing electrically conductive particles on the wiring board, a second process of disposing the semiconductor chip at a predetermined distance from a surface of the resin, and a third process of heating the resin containing the electrically conductive particles and melting the electrically conductive particles and the resin. The third process includes applying vibrations to the molten resin so as to make it flow, and allowing the electrically conductive particles to self-assemble between the connection terminals of the wiring board and the electrode terminals of the semiconductor chip, thereby forming connectors that connect the connection terminals and the electrode terminals electrically.

A bump forming method according to the present invention is a bump forming method for forming bumps on a plurality of electrodes formed on a substrate. The method includes a first process of supplying a resin containing electrically conductive particles on the substrate, and a second process of heating the resin containing the electrically conductive particles and melting the electrically conductive particles. The second process is carried out while applying vibrations externally to the resin, and the molten electrically conductive particles are moved forcibly in the resin by the vibrations applied to the resin and self-assemble on the electrodes of the substrate, thereby forming the bumps on the electrodes.

DESCRIPTION OF THE INVENTION

Figure 1A:
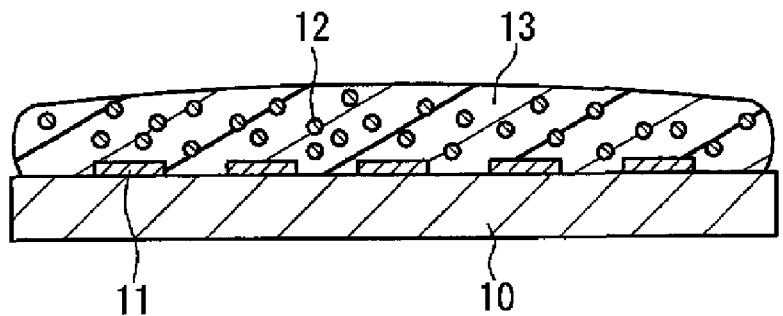
FIGS. 1A to 1C are sectional views showing processes of a flip chip mounting method in an embodiment of the present invention.

The present invention proposes a novel flip chip mounting method capable of allowing molten electrically conductive particles to self-assemble efficiently between terminals.

The concept and characteristics of the present invention are arrived at by finding out that, when a resin containing electrically conductive particles is provided between opposed electrodes or metallic members and then both of the electrically conductive particles and the resin are heated and melted, and then fluidized by applying vibrations, the molten electrically conductive particles assemble on surfaces of the electrodes or metallic members that are wettable, and further self-assemble to form large lumps, making it possible to form electric connectors or metal bumps.

In the flip chip mounting method according to the present invention, by applying vibrations externally to a resin that is supplied between a wiring board and a semiconductor chip and contains electrically conductive particles so as to make the resin flow forcibly, the molten electrically conductive particles dispersed in the resin forcibly are brought into contact with electrode terminals of the wiring board or connection terminals of the semiconductor chip. As a result, it becomes more likely that the molten electrically conductive particles in the resin contact the connection terminals or the electrode terminals, whereby the molten electrically conductive particles self-assemble between the electrode terminals and the connection terminals that have a high wettability, making it possible to form connectors for establishing an electric connection between these terminals in a uniform manner. Furthermore, by curing the resin supplied between the wiring board and the semiconductor chip, it is possible both to establish an electric connection between the terminals and to fix the semiconductor chip to the wiring board at the same time, thus achieving a flip chip mounted body with a high productivity.

Also, since it is possible to allow the molten electrically conductive particles dispersed in the resin to self-assemble reliably between the terminals by vibrating the resin forcibly, the amount of the electrically conductive particles to be contained in the resin can be kept at a minimum. As a result, it becomes possible to reduce the amount of unnecessary electrically conductive particles remaining in the resin after the connectors are formed between the terminals, so that the dielectric strength between the connectors is improved, thereby achieving a flip chip mounted body with a high reliability.

Furthermore, even when the electrode terminals or the connection terminals are arranged in a nonuniform manner, the forcible flowing of the resin can cause the molten electrically conductive particles to self-assemble uniformly between the terminals. Thus, it is possible to achieve a flip chip mounted body that is not limited by the terminal arrangement and thus has a high general versatility.

Also, the ultrasonic vibrations are applied to the resin, thereby causing the cavitation (a foaming phenomenon) in the resin. The generated cavities can make the resin flow more forcibly, so that it is possible to facilitate further the self-assembly of the electrically conductive particles between the terminals. In this way the connectors can be formed between the terminals more reliably.

In the present invention, it is preferable that the electrically conductive particles are solder metal particles.

It is preferable that the resin is formed of a thermosetting resin and the resin is cured by heating or that the resin is formed of a thermoplastic resin and solidified by cooling.

Further, the electrically conductive particles also can be present in a nonconductive state in the resin after forming the connectors.

In the manufacturing method according to the present invention, it is preferable that the flowing of the resin caused by the vibrations applied to the resin is a displacement of the resin relative to the wiring board and the semiconductor chip.

The resin may be formed of a paste-like resin or a sheet-like resin. In either case, the resin is made to flow by heating.

It also may be possible further to include, after forming the connectors in the third process, a fourth process of curing the resin so as to fix the semiconductor chip to the wiring board.

Further, the resin is formed of a thermosetting resin, and the resin is cured by heating in the fourth process.

Moreover, the resin is formed of a thermoplastic resin, and the resin is cured by cooling in the fourth process.

In a preferred embodiment, in the third process, at least one of the wiring board and the semiconductor chip is fixed to a movable stage, and the vibrations are applied to the resin by vibrating the movable stage horizontally or vertically.

In a preferred embodiment, in the third process, the vibrations applied to the resin comprise ultrasonic vibrations.

In a preferred embodiment, in the third process, a cavitation caused by the ultrasonic vibrations applied to the resin makes the molten electrically conductive particles move in the resin forcibly.

In a preferred embodiment, in the third process, the vibrations applied to the resin make the electrically conductive particles move in the resin forcibly.

In a preferred embodiment, a third process of removing the resin is included further, after forming the bumps on the plurality of electrodes in the second process.

The electrically conductive particles used in the present invention can be, for example, solder particles. Any solder particles can be selected and used. For example, they can be solder particles listed in Table 1 below. Exemplary materials shown in Table 1 can be used alone or in combination as appropriate. Incidentally, it is preferable to use electrically conductive particles having a melting point lower than a curing temperature of the thermosetting resin because, by allowing the resin to flow and self-assemble and then heating the resin to cure, it becomes possible to achieve the electric connection and the sealing with the resin.

TABLE 1

| Composition of electrically conductive particles (solder particles) | Melting point (solidus curve) (° C.) |
| --- | --- |
| Sn—58Bi | 139 |
| Sn—37Pb | 183 |
| Sn—9Zn | 199 |
| Sn—3.0Ag—0.5Cu | 217 |
| Sn—3.5Ag | 221 |
| Sn—0.7Cu | 228 |
| 12Sn—2.0Ag—10Sb—Pb | 240 |

The melting point of the electrically conductive particles (solder particles) preferably is 120° C. to 260° C., and further preferably is 139° C. to 240° C. as shown in Table 1. If the melting point is lower than 120° C., a problem tends to occur in durability. If the melting point exceeds 260° C., the selection of the resin becomes difficult.

The mean particle diameter of the electrically conductive particles (solder particles) preferably ranges from 1 µm to 30 µm and further preferably ranges from 5 µm to 20 µm. If the mean particle diameter is less than 1 µm, the electrically conductive particles (solder particles) become difficult to melt due to their surface oxidation, and it tends to take too long to form electric connectors. If the mean particle diameter exceeds 30 µm, it becomes difficult to obtain the electric connectors due to sedimentation. Herein, the mean particle diameter can be measured by using a commercially available particle size distribution meter.

Now, the resin will be described. The resin may be any resin as long as it has a viscosity so as to be flowable in the range of room temperature to a temperature for melting the electrically conductive particles, including a resin whose viscosity lowers to become flowable by heating. Typical examples of the resin include thermosetting resins such as an epoxy resin, a phenolic resin, a silicone resin, a diallyl phthalate resin, a furan resin and a melamine resin, thermoplastic resins such as polyester elastomer, a fluororesin, a polyimide resin, a polyamide resin and an aramid resin, photocurable (ultraviolet curable) resins, and mixtures thereof. Other than the resins, it also is possible to use high boiling solvents, oils, etc.

The mixing ratio by weight of the electrically conductive particles to the resin preferably is in the following range: electrically conductive particles:resin=70 to 30:30 to 70 and further preferably, electrically conductive particles:resin=60 to 40:40 to 60. It is preferable to use the electrically conductive particles and the resin after they are mixed together homogenously. For example, 50 wt % of solder particles and 50 wt % of epoxy resin are mixed homogenously by a kneading machine, and the thus obtained mixture is used. It should be noted that a paste in which the solder particles remain dispersed may be used, or a resin formed into a sheet form may be used.

Next, in the present invention, after or at the same time when the electrically conductive particles and the resin are melted, they are vibrated preferably at a frequency ranging from 240 times/minute (4 Hz) to 80 kHz, which is in a ultrasonic range. The frequency lower than 240 times/minute (4 Hz) and that higher than 80 kHz diminish a cohesion action of the molten electrically conductive particles.

Furthermore, in a preferred example of the present invention, lead-free solder alloy particles whose melting point is 200° C. to 230° C. can be used as the electrically conductive particles, for example. When the resin is the thermosetting resin, it is preferable that the curing temperature of the resin is higher than the melting point of the solder. With this configuration, it is possible to cure the resin during the process of forming the electric connectors or forming metal bumps, thus allowing the operation process to be shortened.

The following is a description of embodiments of the present invention, with reference to the accompanying drawings. In the following drawings, for simplicity of description, constituent elements having substantially the same functions are given the same reference numerals. It should be noted that the present invention is not limited by the embodiments below.

Embodiment 1

Figure 1B:
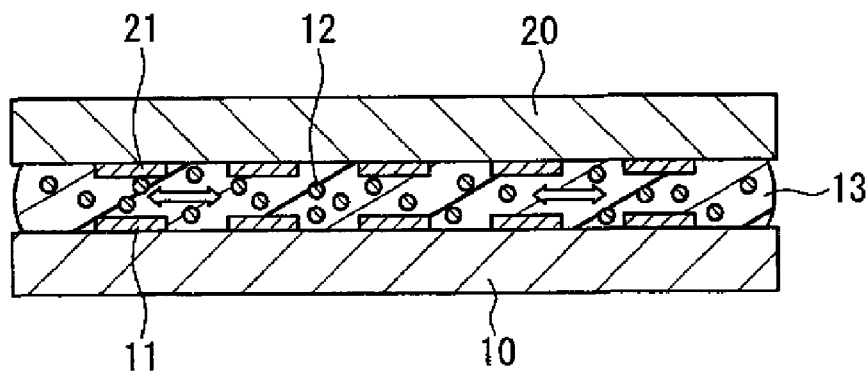
Figure 1C:
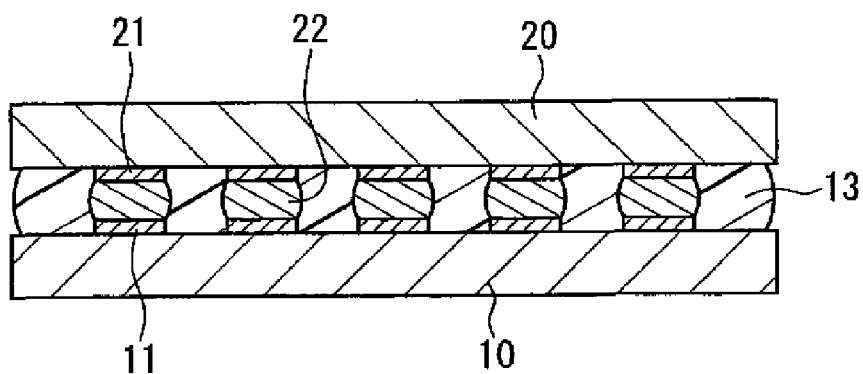

FIGS. 1A to 1C are sectional views showing processes of a flip chip mounting method in an embodiment of the present invention, which illustrate basic processes of the flip chip mounting method according to the present invention.

First, as shown in FIG. 1A, a resin 13 (for example, an epoxy resin in which a mixing ratio of resin to electrically conductive particles was 50 parts by weight of the resin to 50 parts by weight of the electrically conductive particles) containing electrically conductive particles 12 (having a melting point of 217° C., a composition of Sn-3.0 Ag-0.5 Cu and a mean particle diameter of 12 μm, for example) was supplied onto a wiring board 10 having a plurality of connection terminals 11 with a dispenser apparatus. The area of the wiring board 10 was 1 cm², and the supply amount of the mixture of the resin and the electrically conductive particles was 2 mg.

Next, as shown in FIG. 1B, a semiconductor chip 20 having a plurality of electrode terminals 21 was disposed on the surface of the resin 13 so as to be opposed to the connection terminals 11 of the wiring board 10 such that the gap between the connection terminals 11 and the electrode terminals 21 was 40 μm. Thereafter, the resin 13 containing the electrically conductive particles 12 was heated up to 230° C., thereby melting the electrically conductive particles 12. In this process, vibrations along directions indicated by arrows were applied externally to the resin 13, and the resin 13 was made to flow forcibly by the applied vibrations. In this example, ultrasonic vibrations (at a frequency of 40 kHz) were applied. Due to the forcible flowing of the resin 13, the molten electrically conductive particles 12 self-assembled between the connection terminals 11 of the wiring board 10 and the electrode terminals 21 of the semiconductor chip 20, thereby forming connectors 22 for connecting the connection terminals 11 and the electrode terminals 21 electrically as shown in FIG. 1C. The connection terminals 11 and the electrode terminals 21 both had an interval pitch of 200 μm and a diameter of 100 μm. Further, the connectors 22 had a height of 40 μm. Incidentally, the semiconductor chip 20 had a size 10 mm square, and the electrode terminals 21 were present at a pitch of 200 μm in a grid pattern on the surface of the semiconductor chip. The total number of the electrode terminals 21 formed in a grid pattern was 1,600.

According to the method of the present invention, the vibrations were applied externally to the resin 13 supplied between the wiring board 10 and the semiconductor chip 20 so as to make the resin 13 flow forcibly, whereby the molten electrically conductive particles 12 dispersed in the resin 13 were brought forcibly into contact with the connection terminals 11 of the wiring board 10 or the electrode terminals 21 of the semiconductor chip 20 for cohesion. As a result, it became more likely that the molten electrically conductive particles 12 in the resin 13 contacted the connection terminals 11 or the electrode terminals 21, whereby the molten electrically conductive particles 12 self-assembled between the connection terminals 11 and the electrode terminals 21 that had a high wettability, making it possible to form the uniform connectors 22.

Also, since it was possible to allow the molten electrically conductive particles 12 dispersed in the resin 13 to self-assemble reliably between the terminals 11 and 21 by vibrating the resin 13 forcibly, the amount of the electrically conductive particles 12 to be contained in the resin 13 could be kept at a minimum. As a result, it became possible to reduce the amount of unnecessary electrically conductive particles 12 remaining in the resin 13 after the connectors 22 were formed between the terminals 11 and 21, so that the dielectric strength between the connectors 22 was improved, thereby obtaining a flip chip mounted body with a high reliability.

Furthermore, even when the connection terminals 11 or the electrode terminals 21 were arranged in a nonuniform manner, the forcible flowing of the resin 13 caused the molten electrically conductive particles 12 to self-assemble uniformly between the terminals 11 and 12. Thus, it was possible to achieve a flip chip mounted body that was not limited by the terminal arrangement and thus had a high general versatility.

Also, since no solvent was used, the generation of voids caused by solvent volatilization did not occur neither in the portion of the connectors 22 nor in the portion of the resin 13 shown in FIG. 1C.

Here, the vibrations may be applied to the resin 13 not only by allowing the resin 13 itself to vibrate but also by any application methods as long as the resin 13 flows relative to the wiring board 10 and the semiconductor chip 20.

Figure 2:
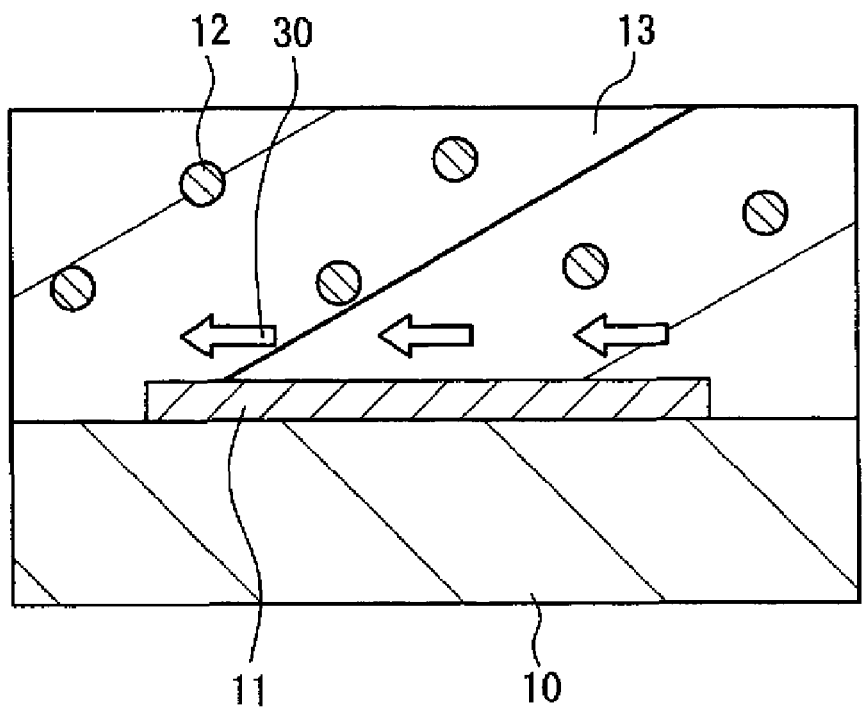
FIG. 2 is a sectional view schematically illustrating shearing stress generated in a resin in an embodiment of the present invention.

FIG. 2 is a sectional view schematically illustrating shearing stress generated in the resin in the present invention. This is an example in which, in addition to the effects described above, the forcible flowing of the resin 13 causes shearing stress 30 in the resin 13 along the surface of the connection terminals 11 of the wiring board 10 (similarly, the surface of the electrode terminals 21 of the semiconductor chip 20) as shown in FIG. 2. By this shearing stress 30, the molten electrically conductive particles 12 in the resin 13 forcibly are pressed against the connection terminals 11 (or the electrode terminals 21), so that it becomes possible to facilitate not only the self-assembly of the electrically conductive particles 12 by their own wettability but also the self-assembly of the molten electrically conductive particles 12 by a strong contact force by the shearing stress 30. Accordingly, the connectors 22 can be formed between the terminals more reliably.

At the same time, the generated shearing stress also makes it possible to remove an oxide film, which is formed on the surfaces of the electrically conductive particles 12 and inhibits bonding of the electrically conductive particles 12. Therefore, the more uniform connectors 22 can be formed between the terminals 11 and 21.

Here, it is preferable that the resin 13 is formed of a paste-like resin. In this case, the resin 13 can be supplied onto the wiring board 10 by rotary application, screen printing, direct dropping or the like. The paste-like resin can be, for example, thermosetting resins such as epoxy resins, silicone resins and phenolic resins.

Also, the resin 13 may be formed of a sheet-like resin. However, such a resin has to have a fluidity in the process of heating the resin 13 so as to melt the electrically conductive particles 12. In this case, the resin 13 can be supplied onto the wiring board 10 by disposing the sheet-like resin directly or by transferring it. The sheet-like resin can be, for example, thermoplastic resins such as vinyl chloride-based resins and vinyl acetate-based resins.

In the process shown in FIG. 1C, after forming the connectors 22, the resin 13 is cured, thereby allowing the semiconductor chip 20 to be fixed to the wiring board 10. This makes it possible to establish the electric connection between the terminals 11 and 21 and fix the semiconductor chip 20 to the wiring board 10 at the same time, thus producing a flip chip mounted body with a high productivity.

The resin 13 can be cured by heating the resin 13 further in the case of using the thermosetting resin and by cooling the resin 13 in the case of using the thermoplastic resin, respectively. Also, a photocurable resin can be used.

Figure 3:
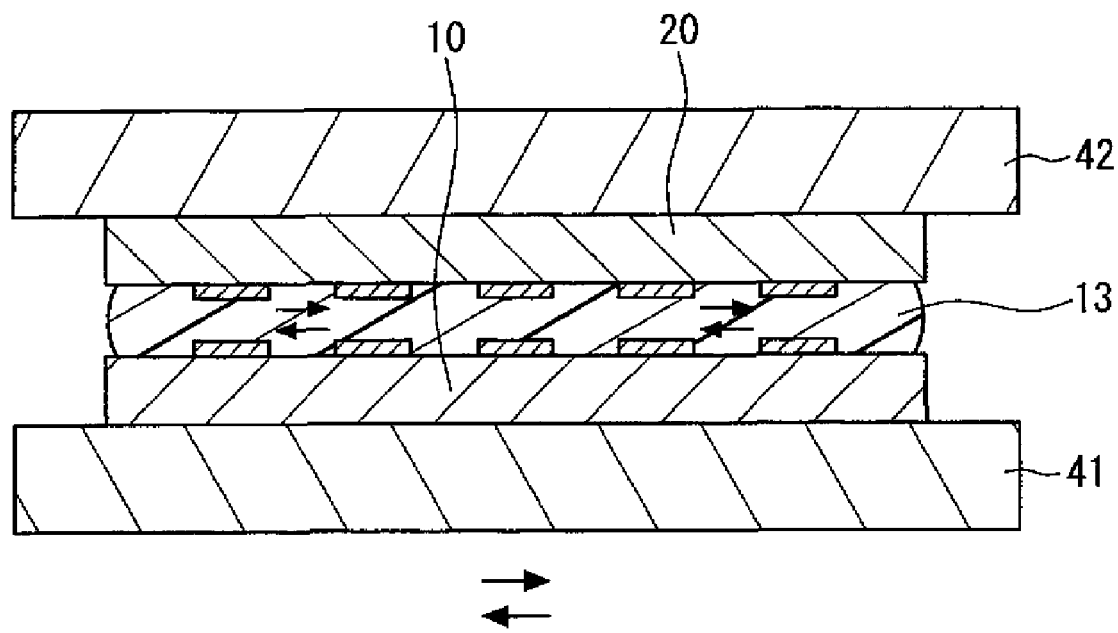
FIG. 3 is a sectional view showing a method for applying vibrations to the resin by vibrating a movable stage horizontally in an embodiment of the present invention.
Figure 4:
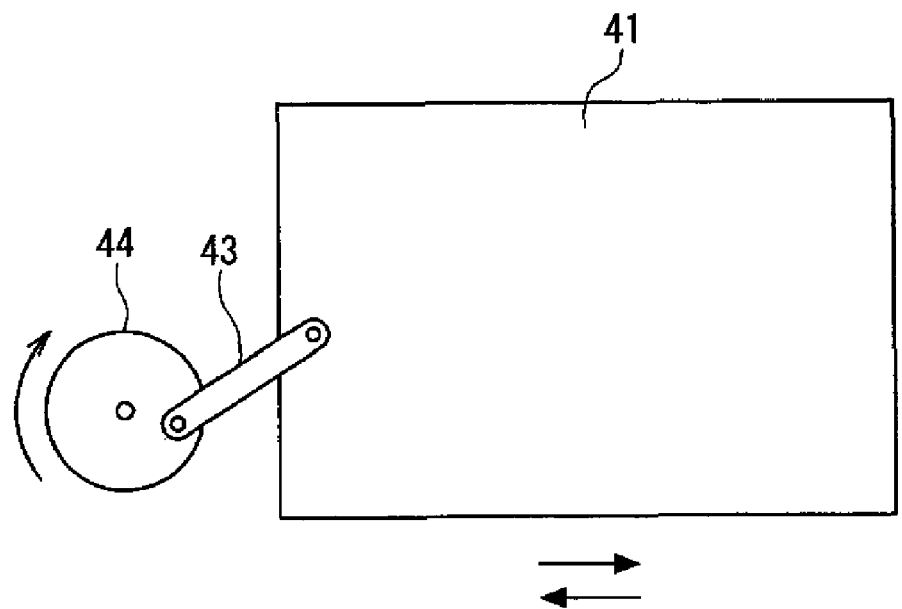
FIG. 4 is a plan view showing a configuration of the movable stage in an embodiment of the present invention.

Now, the following description will be directed to an exemplary method for allowing the resin 13 to flow relative to the wiring board 10 and the semiconductor chip 20 by applying the vibrations externally to the resin 13, with reference to FIGS. 3 and 4.

FIG. 3 is a sectional view showing the method for applying the vibrations to the resin by vibrating a movable stage horizontally in the present invention, and FIG. 4 is a plan view showing a configuration of the movable stage in the present invention.

As shown in FIG. 3, in the state where the resin 13 is supplied between the wiring board 10 and the semiconductor chip 20, the wiring board 10 is fixed to a movable stage 41 and the semiconductor chip 20 is fixed to a fixed stage 42. The movable stage 41 has a configuration as shown in FIG. 4 so as to vibrate horizontally. The movable stage 41 is placed so as to move horizontally in a certain direction (right-left directions in the sheet of drawing) along a rail (not shown) and connected to a rotator 44 via a cam 43 in its end portion. Then, by rotating the rotator 44, the movable stage 41 connected with the cam 43 is moved horizontally. In one example, the amplitude was 0.5 mm, and the frequency was 240 times/minute.

The vibrations of the movable stage 41 cause the wiring board 10 to be displaced relative to the semiconductor chip 20 fixed to the fixed stage 42. In this way, the resin 13 having a viscosity and a surface tension vibrates effectively in directions indicated by arrows in FIG. 3. The frequency and amplitude of the vibrations applied to the resin 13 vary depending on the fluidity (viscosity) of the resin 13 but can be adjusted by varying the radius and rotational speed of the rotator 44, the length of the cam 43, etc.

Figure 5:
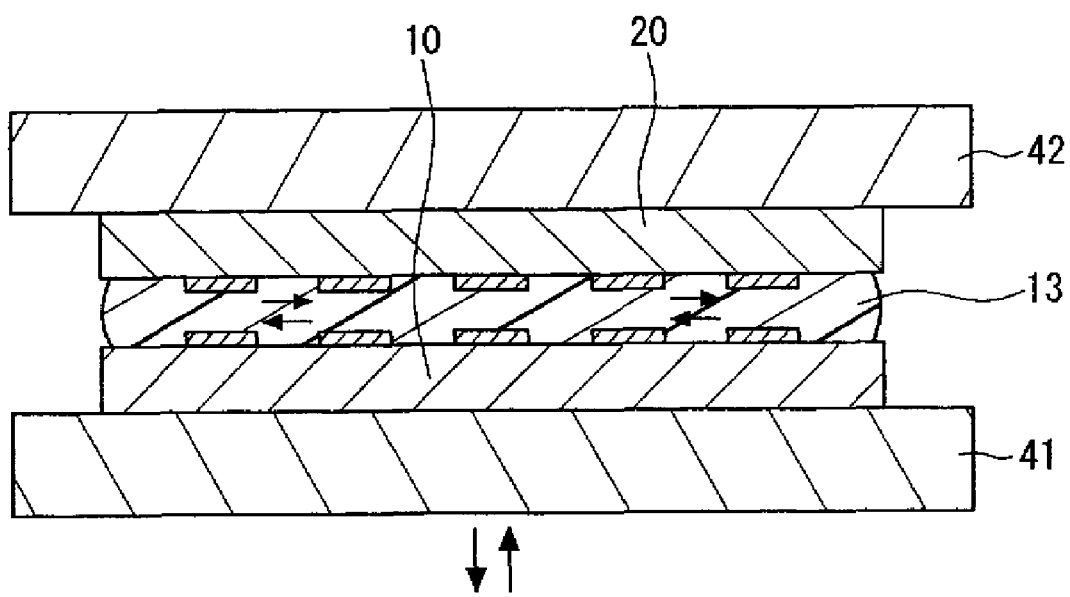
FIG. 5 is a sectional view showing a method for applying vibrations to the resin by vibrating a movable stage vertically in an embodiment of the present invention.

Further, FIG. 5 is a sectional view showing a method for applying vibrations to the resin by vibrating a movable stage vertically in the present invention. As shown in FIG. 5, it also is possible to apply the effective vibrations to the resin 13 similarly by vibrating vertically the movable stage 41 to which the wiring board 10 is fixed. In this case, the resin 13 is compressed repeatedly, whereby the resin 13 effectively vibrates in directions indicated by arrows shown in FIG. 5.

Although FIGS. 3 and 5 have illustrated the examples in which the wiring board 10 is fixed to the movable stage 41 and the semiconductor chip 20 is fixed to the fixed stage 42, the converse configuration may be employed. Further, although the stage 42 has been a fixed stage, it also may be vibrated in a direction different from that for the movable stage 41. The stages 41 and 42 are vibrated in different directions as in the case of vibrating the stage 42 in an opposite direction from that of the stage 41 and the case of vibrating the stage 41 horizontally and the stage 42 vertically, for example, whereby a plurality of different vibrations can be applied to the resin 13, achieving similar or greater vibration effects.

In the above-described example, the wiring board 10 and the semiconductor chip 20 are displaced relative to each other, thereby applying effective vibrations to the resin 13. In the following, examples of applying vibrations to the resin 13 itself will be described, with reference to FIGS. 6 and 7.

Figure 6:
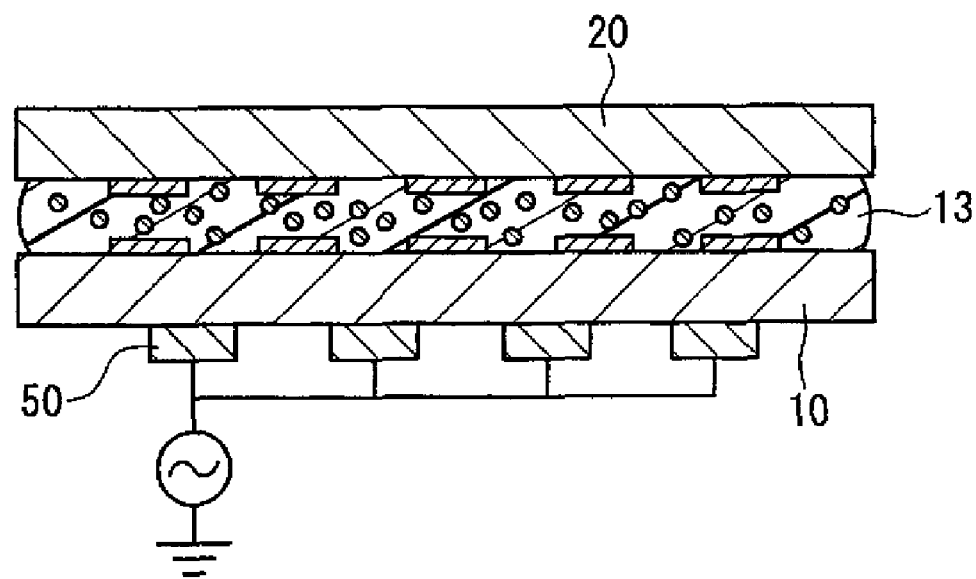
FIG. 6 is a sectional view showing a method for applying vibrations to the resin using vibrators in an embodiment of the present invention.
Figure 7:
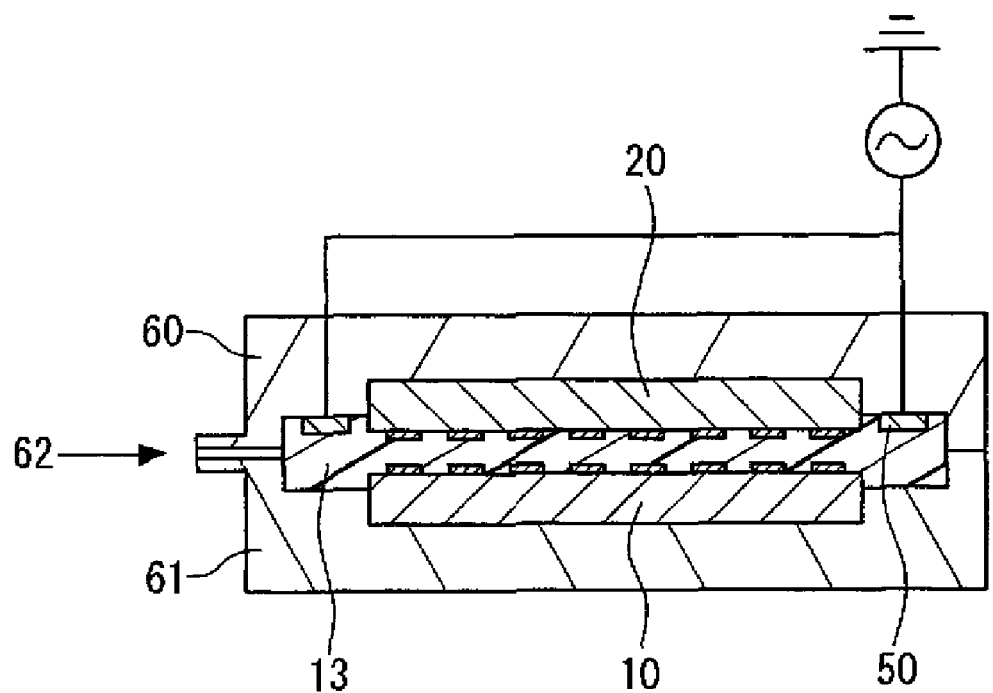
FIG. 7 is a sectional view showing a method for applying vibrations to the resin using molds in an embodiment of the present invention.

FIG. 6 is a sectional view showing a method for applying vibrations to the resin using vibrators in the present invention, and FIG. 7 is a sectional view showing a method for applying vibrations to the resin using molds in the present invention.

In the example illustrated by FIG. 6, a plurality of vibrators 50 are attached to the surface of the wiring board 10 (or the semiconductor chip 20) and supplied with a voltage so that vibrations are generated in the vibrators 50. These vibrations are propagated into the resin 13 via the wiring board 10. Accordingly, the resin 13 itself is made to flow forcibly, thereby making it possible to displace the resin 13 relative to the wiring board 10 and the semiconductor chip 20.

Further, in the example illustrated by FIG. 7, after the semiconductor chip 20 and the wiring board 10 respectively are placed in an upper mold 60 and a lower mold 61, these molds 60 and 61 are mated. The resin 13 is injected through an inlet 62 into a space surrounded by the molds 60 and 61, whereby the resin 13 is supplied between the wiring board 10 and the semiconductor chip 20. Inside the upper mold 60 (or/and the lower mold 61), a plurality of vibrators 50 are attached. By applying a voltage to the mold so that vibrations are generated in the vibrators 50, the vibrations are propagated into the resin 13. Since this method can apply the vibrations directly to the resin 13, it becomes possible to allow the resin 13 to flow efficiently.

The present invention is characterized in that the resin 13 is made to flow forcibly by applying the vibrations externally to the resin 13. Furthermore, by applying ultrasonic vibrations to the resin 13, it is possible to apply to the resin 13 repeated vibrations at extremely high frequencies from 20 kHz to an ultrasonic range exceeding 1 MHz. Strong frictional force and contact force of the molten electrically conductive particles 12 caused by the shearing stress 30 in the resin 13 along the surfaces of the connection terminals 11 of the wiring board 10 and the surfaces of the electrode terminals 21 of the semiconductor chip 20 schematically shown in FIG. 2 are generated at high repetition frequencies, thereby facilitating the self-assembly of the molten electrically conductive particles 12.

In addition, when the ultrasonic vibrations are combined with the vibrations to be applied to the resin 13, it is possible to cause cavitation (a foaming phenomenon) in the resin 13, so that the resin 13 can be made to flow more forcibly.

Figure 8A:
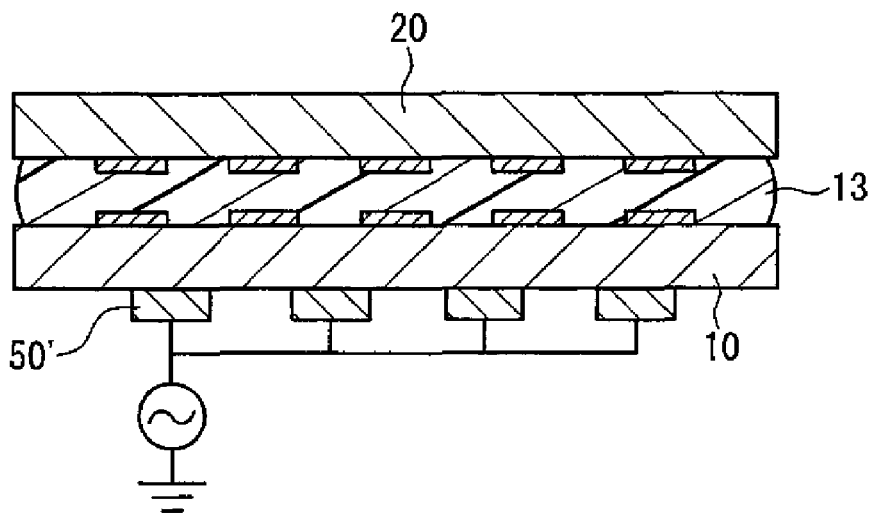
FIGS. 8A to 8C are sectional views for describing a state of cavitation generated by ultrasonic vibrations in an embodiment of the present invention.
Figure 8B:
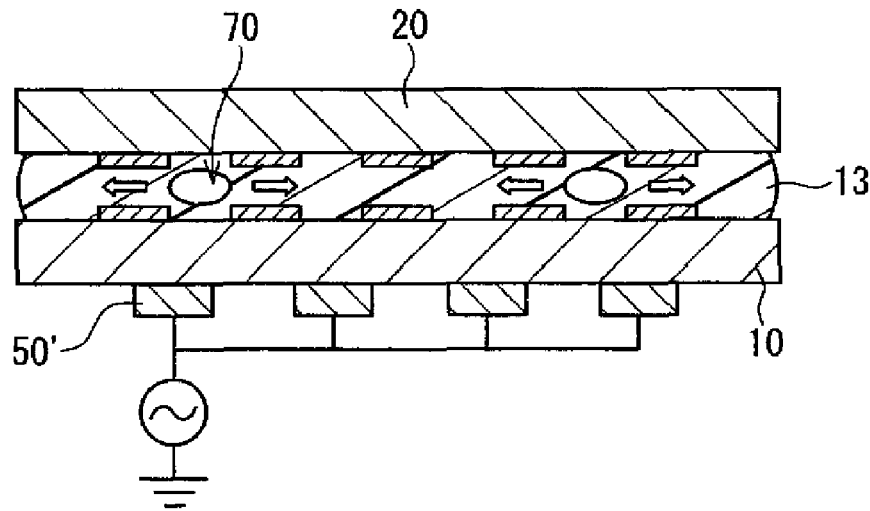
Figure 8C:
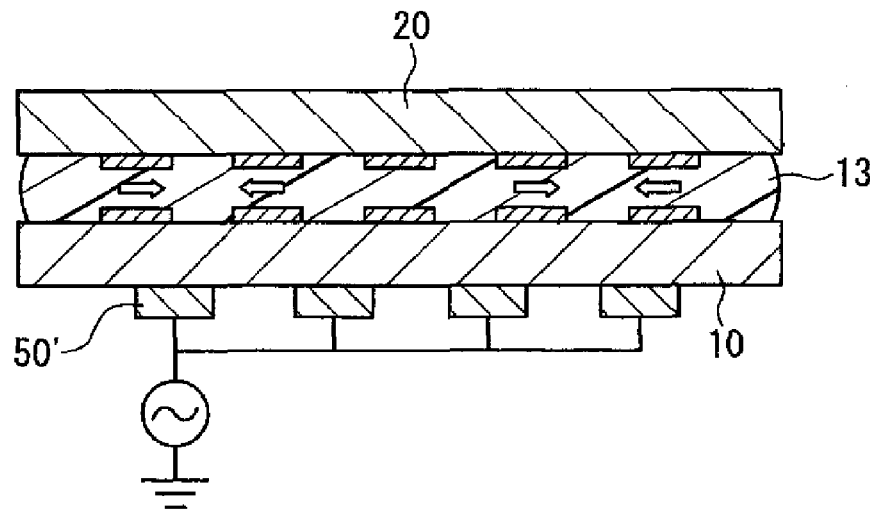

FIGS. 8A to 8C are sectional views for describing how the cavitation is caused by the ultrasonic vibrations in the present invention. FIG. 8 schematically illustrates how the cavitation occurs by applying the ultrasonic vibrations to the resin 13. As shown in FIG. 8A, a plurality of ultrasonic vibrators 50' are attached to the surface of the wiring board 10 (or the semiconductor chip 20) and supplied with a voltage so that the ultrasonic vibrations are propagated into the resin 13 via the wiring board 10.

Due to the ultrasonic vibrations propagated into the resin 13, as shown in FIG. 8B, a large number of cavities 70 are generated in the resin 13, and the grown cavities 70 forcibly push out the resin 13 around the cavities 70 in directions indicated by arrows. Then, as shown in FIG. 8C, when the cavities 70 disappear, the resin 13 in turn is pushed back to where the cavities 70 were present. In this manner, the generation and disappearance of the cavities 70 are repeated, so that the resin 13 is treated as if vibrations were applied to it effectively. Accordingly, the self-assembly of the electrically conductive particles in the resin 13 can be facilitated further.

Embodiment 2

The characteristic technique in the flip chip mounting method according to the present invention also is applicable to a bump forming method. In the following, the bump forming method according to the present invention will be described, with reference to FIGS. 9A to 9D.

FIG. 9 shows cross-sections of processes of the bump forming method in an embodiment of the present invention.

Figure 9A:
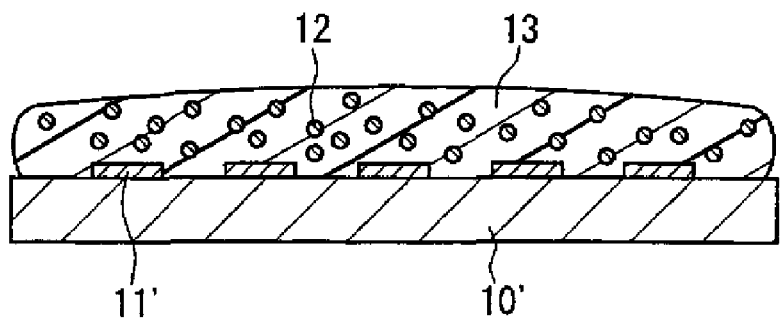
FIGS. 9A to 9D are sectional views showing processes of a bump forming method in another embodiment of the present invention.
Figure 9B:
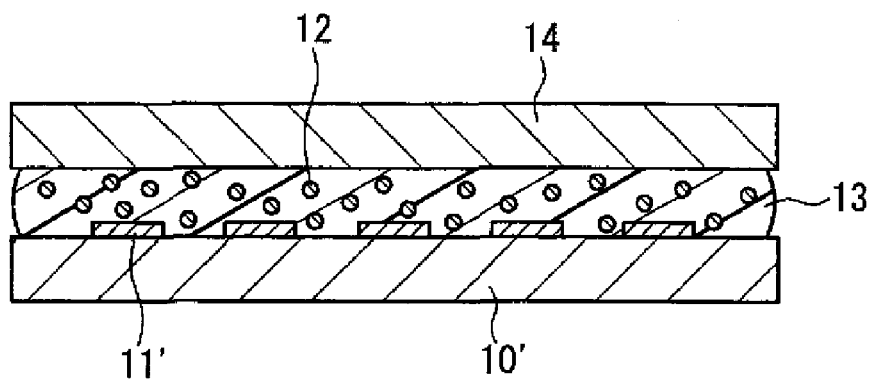
Figure 9C:
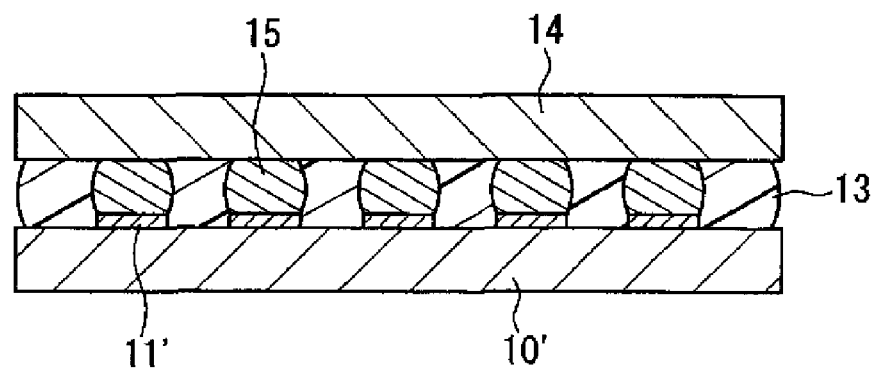
Figure 9D:
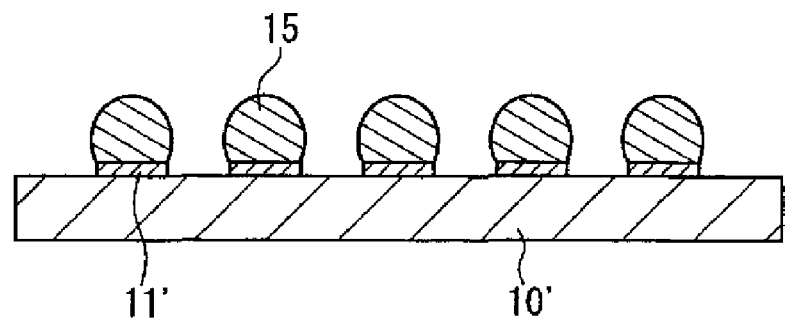

As shown in FIG. 9A, a resin 13 containing electrically conductive particles 12 is supplied onto a substrate 10' provided with a plurality of electrodes 11'. Next, as shown in FIG. 9B, in the state where a flat plate 14 is placed at a predetermined distance (for example, 40 μm) from a surface of the resin 13, the resin 13 containing the electrically conductive particles 12 is heated, thus melting the electrically conductive particles 12. This process is carried out while applying vibrations externally to the resin 13 and allowing the resin 13 to flow forcibly by these vibrations. Due to the forcible flowing of the resin 13, the molten electrically conductive particles 12 self-assemble on the electrodes 11' of the substrate 10', thus forming bumps 15 on the electrodes 11' as shown in FIG. 9C. Thereafter, as shown in FIG. 9D, by removing the flat plate 14 and the resin 13, the substrate 10' with the bumps formed on the electrodes 11' is completed.

With the method according to the present invention, by applying the vibrations externally to the resin 13 supplied on the substrate 10', the resin 13 is made to flow forcibly, thus making it possible to bring the molten electrically conductive particles 12 dispersed in the resin 13 forcibly into contact with the electrodes 11 of the substrate 10'. As a result, it becomes more likely that the molten electrically conductive particles 12 in the resin 13 contact the electrodes 11', whereby the molten electrically conductive particles 12 self-assemble on the electrodes 11' that have a high wettability, making it possible to form the uniform bumps 15.

Here, the substrate 10' is appropriate as long as it is obtained by forming the electrodes 11' on the surface of a wiring board, a semiconductor chip or the like. Also, the method for applying vibrations to the resin 13 can be similar to that used in the above-described flip chip mounting method.

Although the present invention has been described by way of preferred embodiments, these descriptions do not limit the present invention. It of course is possible to make various modifications. For example, the vibrations to be applied to the resin 13 are not limited to linear vibrations but may be vibrations in various other modes such as circular vibrations and elliptic vibrations. Also, it does not matter whether transverse vibrations or longitudinal vibrations are employed. Further, the vibrations applied to the resin 13 bring about an effect in which the electrically conductive particles 12 themselves are moved forcibly in the resin 13. This effect further facilitates the self-assembly of the electrically conductive particles 12 between the terminals.

INDUSTRIAL APPLICABILITY

In accordance with the present invention, it is possible to provide a highly-productive and highly-reliable flip chip mounting method that can be applied to flip chip mounting of next-generation LSIs, and a bump forming method.

The invention claimed is:

1. A flip chip mounting method, in which a semiconductor chip having a plurality of electrode terminals is disposed so as to be opposed to a wiring board having a plurality of connection terminals and the connection terminals of the wiring board and the electrode terminals of the semiconductor chip are connected electrically; the method comprising:
    a first process of supplying a resin containing electrically conductive particles on the wiring board;
    a second process of disposing the semiconductor chip at a predetermined distance from a surface of the resin; and
    a third process of heating the resin containing the electrically conductive particles and melting the electrically conductive particles and the resin;
    wherein the third process comprises applying vibrations to the molten resin so as to make it flow, and allowing the electrically conductive particles to self-assemble between the connection terminals of the wiring board and the electrode terminals of the semiconductor chip, thereby forming connectors that connect the connection terminals and the electrode terminals electrically.

2. The flip chip mounting method according to claim 1, wherein the flowing of the resin caused by the vibrations applied to the resin in the third process comprises a displacement of the resin relative to the wiring board and the semiconductor chip.

3. The flip chip mounting method according to claim 1, wherein the resin is formed of a paste-like resin.

4. The flip chip mounting method according to claim 1, wherein the resin is formed of a sheet-like resin, and in the third process, the sheet-like resin is made to flow by heating.

5. The flip chip mounting method according to claim 1, further comprising, after forming the connectors in the third process,
    a fourth process of curing or solidifying the resin so as to fix the semiconductor chip to the wiring board.

6. The flip chip mounting method according to claim 5, wherein the resin is formed of a thermosetting resin, and the resin is cured by heating in the fourth process.

7. The flip chip mounting method according to claim 5, wherein the resin is formed of a thermoplastic resin, and the resin is solidified by cooling in the fourth process.

8. The flip chip mounting method according to claim 1, wherein in the third process, at least one of the wiring board and the semiconductor chip is fixed to a movable stage, and the vibrations are applied to the resin by vibrating the movable stage horizontally or vertically.

9. The flip chip mounting method according to claim 1, wherein in the third process, the vibrations applied to the resin comprise ultrasonic vibrations.

10. The flip chip mounting method according to claim 9, wherein in the third process, a cavitation caused by the ultrasonic vibrations applied to the resin makes the molten electrically conductive particles move in the resin.

11. The flip chip mounting method according to claim 1, wherein in the third process, the vibrations applied to the resin make the electrically conductive particles move in the resin.

12. A bump forming method for forming bumps on a plurality of electrodes formed on a substrate; the method comprising:

a first process of supplying a resin containing electrically conductive particles on the substrate; and a second process of heating the resin containing the electrically conductive particles and melting the electrically conductive particles;

wherein the second process is carried out while applying vibrations externally to the resin, and the molten electrically conductive particles are moved forcibly in the resin by the vibrations applied to the resin and self-assemble on the electrodes of the substrate, thereby forming the bumps on the electrodes.

13. The bump forming method according to claim 12, further comprising a fourth third process of removing the resin, after forming the bumps on the plurality of electrodes in the second process.

14. The bump forming method according to claim 12, wherein a flat plate is placed on the resin containing the electrically conductive particles between the first process and the second process, and the flat plate is removed after forming the bumps on the electrodes.

* * * * *